United States Patent

Pinney

[11] Patent Number: 6,094,391
[45] Date of Patent: *Jul. 25, 2000

[54] EQUILIBRATE CIRCUIT FOR DYNAMIC PLATE SENSING MEMORIES

[75] Inventor: David L. Pinney, Boise, Id.

[73] Assignee: Micron Technology, Inc., Boise, Id.

[*] Notice: This patent is subject to a terminal disclaimer.

[21] Appl. No.: 09/233,938

[22] Filed: Jan. 20, 1999

Related U.S. Application Data

[63] Continuation of application No. 08/915,186, Aug. 20, 1997, Pat. No. 5,923,603.

[51] Int. Cl.[7] .................................................. G11C 7/00
[52] U.S. Cl. ........................ 365/203; 365/196; 365/207
[58] Field of Search ..................................... 365/203, 191, 365/230.05, 190, 196, 207

[56] References Cited

U.S. PATENT DOCUMENTS

| | | | |
|---|---|---|---|
| 4,355,377 | 10/1982 | Sud et al. | 365/203 |
| 4,398,270 | 8/1983 | Taylor | 365/203 |
| 4,494,221 | 1/1985 | Hardee et al. | 365/203 |
| 5,235,550 | 8/1993 | Zagar | 365/226 |
| 5,297,087 | 3/1994 | Porter | 365/201 |
| 5,351,215 | 9/1994 | Tanabe | 365/203 |
| 5,424,976 | 6/1995 | Cuppens | 365/145 |
| 5,546,338 | 8/1996 | Proebsting | 365/181 |
| 5,574,679 | 11/1996 | Ohtsuki et al. | 365/145 |
| 5,654,933 | 8/1997 | McLaury | 365/230.05 |
| 5,754,478 | 5/1998 | Morgan et al. | 365/189.01 |
| 5,923,603 | 7/1999 | Pinney | 365/203 |

OTHER PUBLICATIONS

Lu, N., et al., "Half–$V_{DD}$ Bit–Line Sensing Scheme in CMOS DRAM's", IEEE Journal of Solid–State Circuits, vol. SC–19, No. 4, Aug. 1984.

Asakura, M., et al., "Cell–Plate Line Connecting Complementary Bit–Line ($C^3$) Architecture for Battery–Operating DRAM's", IEEE Journal of Solid–State Circuits, vol. 27, No. 4, Apr. 1992.

*Primary Examiner*—David Nelms
*Assistant Examiner*—Thong Le
*Attorney, Agent, or Firm*—Kirkpatrick & Lockhart LLP

[57] ABSTRACT

The present invention is directed to a circuit for equilibrating a bitline and a plateline of a dynamic plate sensing memory device. The circuit includes a first device for driving the plateline toward a predetermined voltage in response to a first control signal, a second device for driving the bitline toward the predetermined voltage in response to a second control signal, and a third device for connecting the plateline to the bitline in response to a third control signal. A method for equilibrating a plateline and a bitline of a dynamic plate sensing memory device is also disclosed.

30 Claims, 4 Drawing Sheets

EQUILIBRATE CIRCUIT FOR DYNAMIC PLATE SENSING MEMORIES

CROSS REFERENCE TO RELATED APPLICATIONS

This is a continuation of U.S. patent application Ser. No. 08/915,186, filed on Aug. 20, 1997, now U.S. Pat. No. 5,923,603.

BACKGROUND OF THE INVENTION

1. Field of the Invention

The present invention is directed generally to a semiconductor memory device and, more particularly, to an equilibrate circuit for dynamic plate sensing semiconductor memories.

2. Description of the Background

In a conventional dynamic random access memory (DRAM) device each memory cell, or memory bit, consists of one transistor and one capacitor. A terminal of the transistor is connected to a digitline, or bitline, of the memory device. Another terminal of the transistor is connected to a terminal of the capacitor and the gate terminal of the transistor is connected to a wordline of the memory device. The transistor thus acts as a gate between the bitline and the capacitor.

The second terminal of the capacitor is connected to a voltage rail which carries a voltage, such as VCC/2. Thus, when the wordline for a particular cell is active, the gate transistor is in a conducting state and the capacitor is connected to the bitline. The capacitor stores a charge that, depending on whether the polarity of the voltage across the capacitor is positive or negative, represents either a logic high or a logic low values Memory devices are typically constructed with complementary bitlines of equal capacitance. Sense amplifiers are connected between the bitlines and operate to sense the differential voltage across the bitlines. Before a memory cell is selected for access, the complementary bitlines must be equilibrated to minimize the cell access time. Equilibration circuits typically short the complementary bitlines together, resulting in an equilibrate voltage equal to the voltage midpoint between the two equal capacitance and logically opposite bitlines.

In a dynamic plate sensing memory device, each memory cell typically consists of a transistor and a capacitor. The transistor is connected to a bitline and the terminal of a capacitor. The other terminal of the capacitor is connected to a cell plateline. A wordline is connected to the gate terminal of the transistor. Thus, the capacitor is connected between the bitline and the plateline when the wordline is active.

Certain types of dynamic plate sensing memory devices, such as 6F² dynamic plate sensing memory devices, do not have complementary bitline architectures. Thus, conventional techniques of equilibrating bitlines, such as that shown in Asakura, et al., "Cell-Plate Line Connecting Complementary Bit-Line (C3) Architecture for Battery-Operating DRAM's", IEEE Journal of Solid-State Circuits, vol. 27, no. 4, April 1992, pp. 597–602, would be ineffective because such conventional techniques require complementary bitlines that can be shorted together to obtain the midpoint of the equal and opposite capacitances of the bitlines.

Thus, the need exists for an equilibrate circuit that is capable of equilibrating the bitlines and the platelines, which have unequal capacitances, of a dynamic plate sensing memory device which does not have a complementary bitline architecture.

SUMMARY OF THE INVENTION

The present invention, according to its broadest implementation, is directed to a circuit for equilibrating non-symmetric differential inputs of a memory device that require equilibration. The circuit comprises a first device for driving the plateline toward a predetermined voltage, a second device for driving the bitline toward the predetermined voltage, and a third device for connecting the bitline to the plateline.

The present invention also contemplates a semiconductor dynamic plate sensing memory device with a memory array, read and write circuits, and a plurality of equilibrate circuits. The equilibrate circuits comprise a first device for driving the plateline toward a predetermined voltage, a second device for driving the bitline toward the predetermined voltage, and a third device for connection the plateline to the hitline.

The present invention may also be a part of a complete memory device which itself may be a part of a system The system may comprise a processor, a memory controller, a plurality of memory devices with equilibrate circuits, and two buses.

The present invention also contemplates a method for equilibrating a plateline and a-bitline of a dynamic plate sensing memory device.

The present invention represents a substantial advance over prior equilibrate circuits. Because the present invention does not rely on complementary bitlines to equalize the bitlines, it may be incorporated in dynamic plate sensing memory devices that do not have complementary bitlines. This, and other advantages and benefits of the present invention, will become apparent from the Detailed Description of the Preferred Embodiments hereinbelow.

BRIEF DESCRIPTION OF THE DRAWINGS

For the present invention to be clearly understood and readily practiced, the present invention will be described in conjunction with the following figures, wherein.

DETAILED DESCRIPTION OF THE PREFERRED EMBODIMENTS

It is to be understood that the figures and descriptions appearing herein have been simplified to illustrate elements that are relevant for a clear understanding of the present invention, while eliminating, for purposes of clarity, many other elements found in a typical memory device. Those of ordinary skill in the art will recognize that other elements are desirable and/or required to implement, for example, a memory device incorporating the present invention. However, because such elements are well known in the art, and because they do not facilitate a better understanding of the present invention, a discussion of such elements is not provided herein. Although the present invention is described herein in conjunction with a dynamic plate sensing memory device, it can be understood by those skilled in the art that the present invention could be incorporated in any type of dynamic memory, including a synchronous dynamic random access memory (SDRAM) or and SDRAM/EDO.

Figure 1:
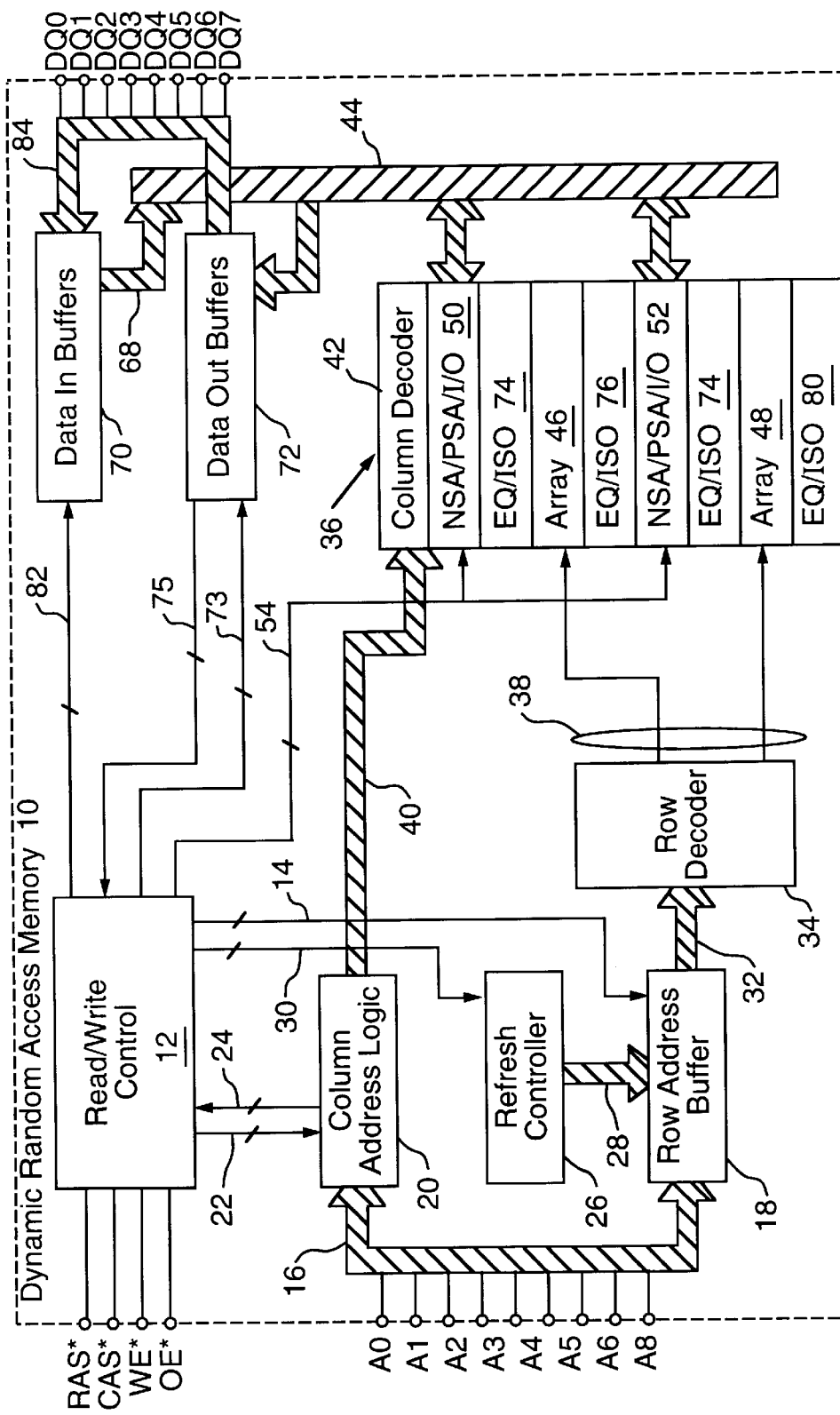
FIG. 1 is a block diagram of a memory device in which the equilibrate circuit of the present invention may be used.

FIG. 1 shows a dynamic plate sensing random access memory device 10. Input control signals row address strobe (RAS*), AS column address strobe (CAS*), write enable (WE*), and output enable (OE*) are input to a read/write control circuit 12. When the signal RAS* is at a logic low state, the read/write control circuit 12 generates control signals 14 which control the latching of the contents of an address bus 16 into a row address buffer 18. The contents of the address bus 16 are also latched into a column address logic circuit 20 in response to control signals 22. Address change signals 24 communicate changes in the column address to the read/write control circuit 12.

A refresh controller circuit 26 generates the contents of a row address bus 28 in response to control signals 30 which are generated by the read/write control circuit 12 when the signal RAS* is pulsed while the signal CAS* is at a logic low state. The row address buffer 18 generates the contents of a row address bus 32, which is input to a row decoder circuit 34. The contents of the row address bus 32 represent either the address latched into the row address buffer 18 or the refresh address provided by the refresh controller 26, depending on whether the desired operation is a normal operation or a refresh operation.

The row address buffer 18 and the column address logic circuit 20 determine which memory cell in a memory array 36 will be selected for a read or a write operation. The row decoder 34 activates one or more row activating signals 38. The column address logic circuit 20 generates the contents of a column address bus 40, which are input to a column decoder 42. The column decoder 42 selects one or more columns of the memory array 36. The memory array 36 consists of a multiple of, for example, two arrays 46 and 48. 9 sense amplifier, N-sense amplifier, and input/output multiplexor circuits 50 and 52 are connected between the bitlines and the platelines of the memory array 36. The P-sense amplifier, N-sense amplifier, and input/output multiplexor circuits 50 and 52 are responsive to control signals 54. In refresh mode, the content of a memory cell is refreshed by the sense amplifiers and during a write operation, the sense amplifiers establish the proper cell contents in response to write data signals 68 from data in buffers 70. During a read operation, the sense amplifiers amplify the content of the read cell and presents it to data output buffers 72 on the global input/output bus 44. The data output buffers 72 receive control signals 73 and provide feedback signals 75 to the read/write control circuit 12.

Figure 3:
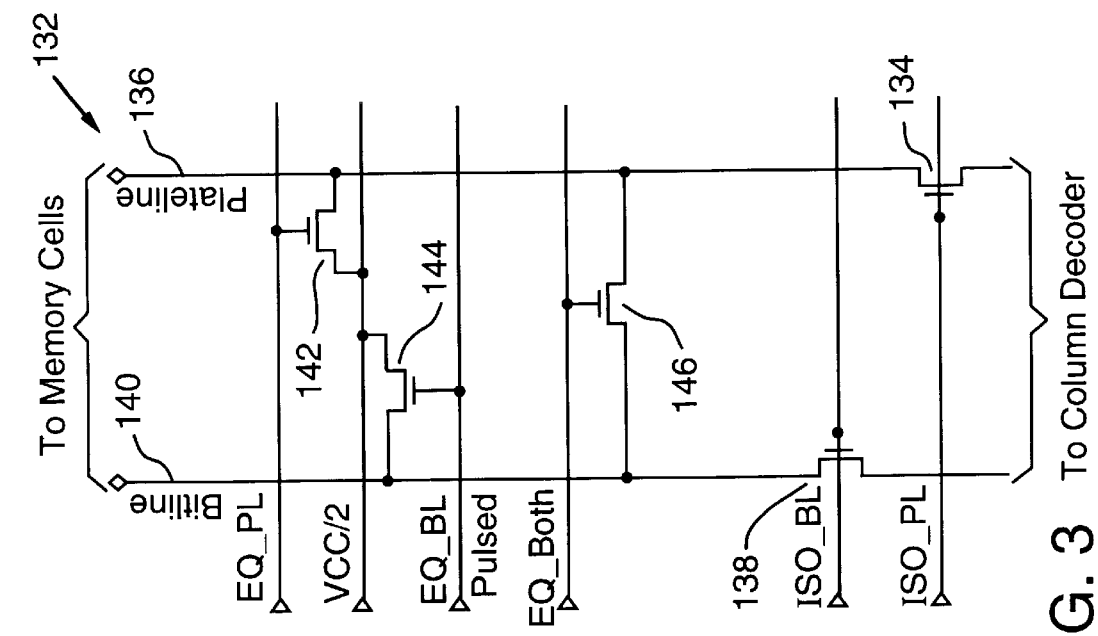
FIG. 3 is a circuit schematic of an equilibrate circuit according to another preferred embodiment of: the present invention.
Figure 2:
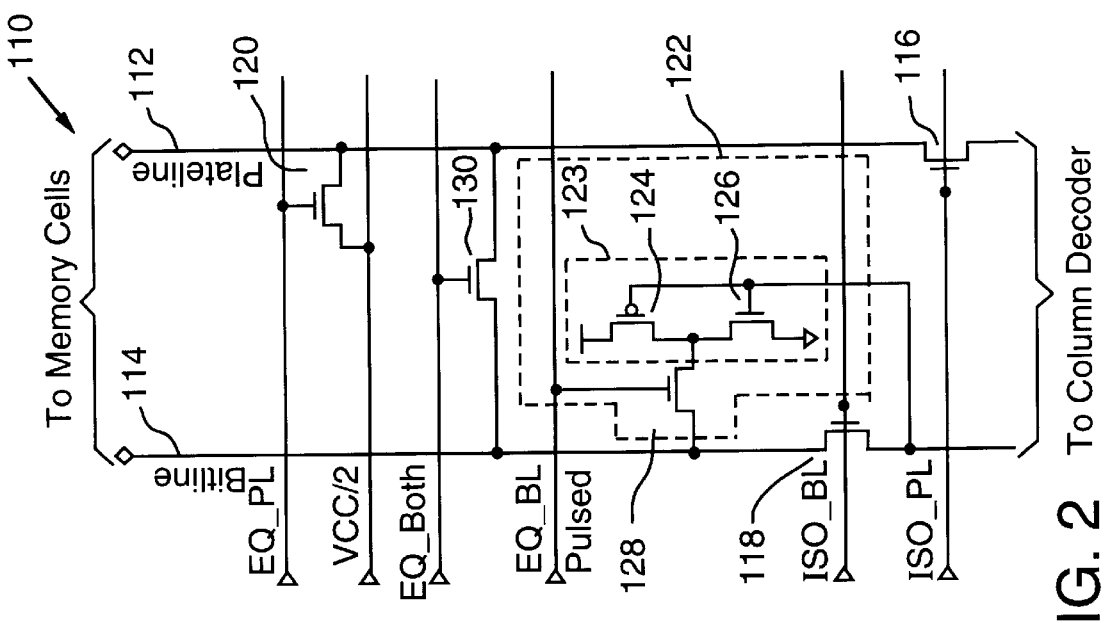
FIG. 2 is a circuit schematic of an equilibrate circuit according to a preferred embodiment of the present invention.
Figure 4:
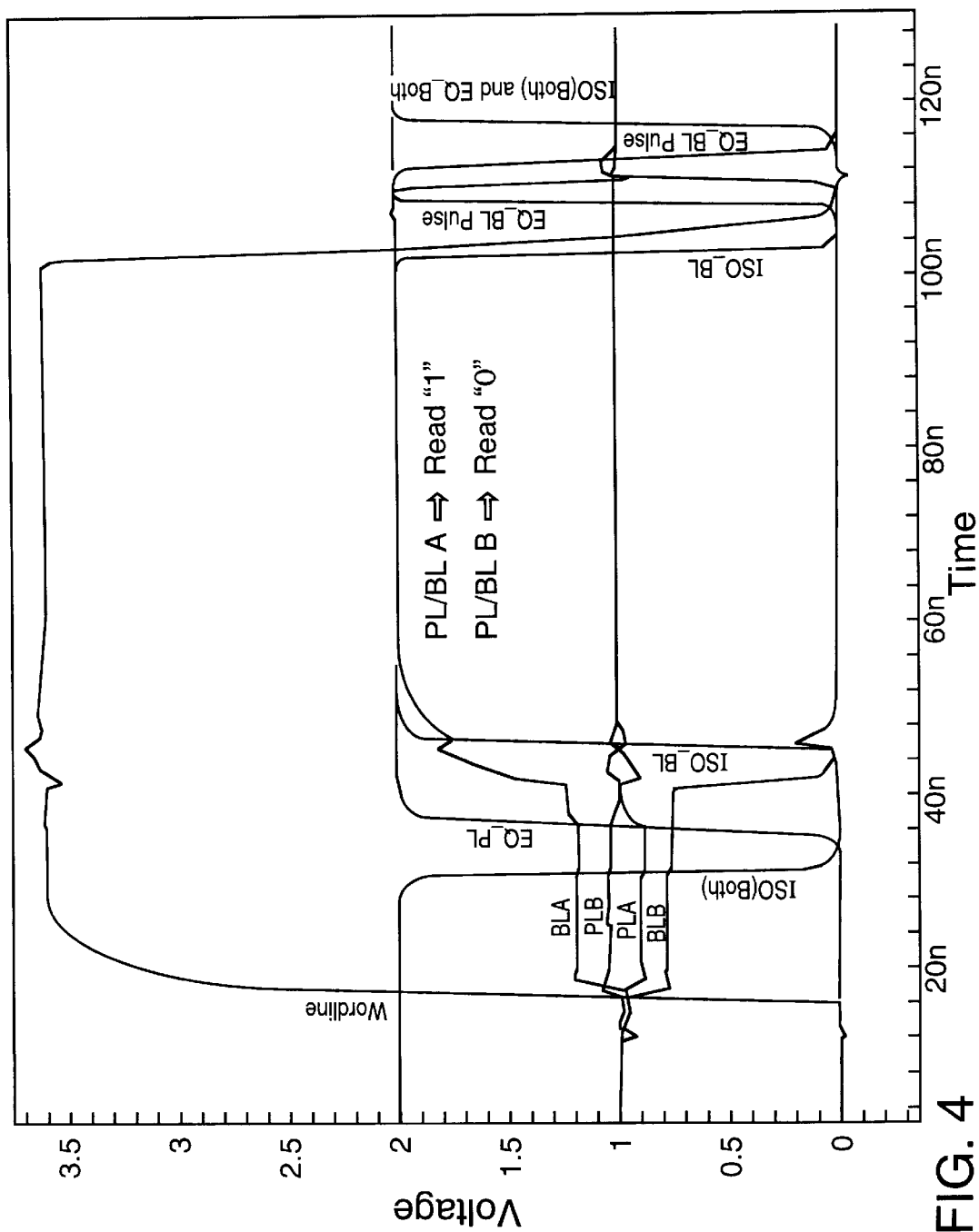
FIG. 4 is a timing diagram depicting the operation of the equilibrate circuit of the present invention.

Equilibrate/isolation circuits 74, 76, 78, and 80, as more fully described herein in conjunction with FIGS. 2–4, are located on the bitline and the plateline. The equilibrate/isolation circuits 74, 76, 78, and 80 isolate portions of the bitline and the plateline, precharge the bitline and the plateline and equilibrate the bitline and the plateline to an intermediate voltage value.

The read/write control circuit 12 provides control signals 82 to the data in buffers 70. The data in buffers 70 are driven by a data bus 84, which is connected to, in the example shown in FIG. 1, individual input/output pads DQ0 through DQ7.

FIG. 2 shows a preferred embodiment of an equilibrate circuit 110 for a plate sensing memory device. The equilibrate circuit 110 is illustrated as a portion of a plate sensing memory device which has a plateline 112 and a bitline 114. The memory cell devices, which are typically a capacitor and a gate transistor that are positioned between the bitline and the plateline, are not shown in FIG. 2. However, it can be understood by those skilled in the art that such devices would be included in a plate sensing memory device, a portion of which is depicted in FIG. 2. Also, other supporting circuitry, such as a column decoder, is not shown in FIG. 2. It can be understood by those skilled in the art that such circuitry would be included in a plate sensing memory device.

A plateline isolation transistor 116 is connected between portions of the plateline 112. The plateline isolation transistor 116 is responsive to a signal ISO_PL, which is driven to a logic high value to isolate portions of the plateline 112 from other portions of the plateline 112, such as the portion connected to a column decoder. A bitline isolation transistor 118 is connected between portions of the bitline 114. The bitline isolation transistor 118 is responsive to a signal ISO_BL, which is driven to a logic high value to isolate portions of the bitline 114 from other portions of the bitline 114, such as the portion connected to a column decoder.

A plateline equilibration transistor 120 is connected between a power rail, which has, for example, a midpoint voltage value of VCC/2, and the plateline 112. The transistor 120 is responsive to a signal EQ_PL, which is driven to a logic high value to cause the transistor 120 to become conductive. When the transistor 120 is conductive, the plateline 112 is shorted to the power rail, thereby driving the voltage on the plateline 112 toward the voltage on the rail, to precharge the plateline 112. The transistor is usually held conductive to allow the voltage on the plateline to reach or nearly reach, the value of the voltage on the voltage rail. The transistor 120 can be, for example, a "strong" device that is sized to provide enough current such that the RC load of the node being driven becomes the primary factor in determining the delay in switching the node, and not the current that is supplied by the transistor 120 or the transistor's switching time.

An on-pitch circuit 122 connects the bitline 114 to either GND or VCC, depending on the voltage value of the bitline 114. The on-pitch circuit 122 includes an inverter circuit 123. An on-pitch circuit would be repeated for each bitline/plateline pair in the plate sensing memory device. If the voltage value of the bitline 114 corresponds to a logic low value, a p-type transistor 124 is turned on and conducts a voltage value corresponding to approximately VCC. If the voltage value of the bitline 114 corresponds to a logic high value, an n-type transistor 126 is turned on and provides a partial path to GND. When a signal EQ_BL is pulsed, a transistor 128 is pulsed on and the bitline 114 is charged toward VCC through the transistors 124 and 128 or is discharged toward GND through the transistors 128 and 126, depending on the voltage that was previously present on the bitline 114, until the bitline reaches a midpoint voltage, such as VCC/2.

A transistor 130, which is connected between the plateline 112 and the bitline 114, operates to equilibrate the plateline 112 and the bitline 114 when a signal EQ_BOTH is driven high. The transistor 130 is, for example, a "weak" device that can limit the current due to a defect in the memory device such that the standby current of the memory device will be within acceptable limits. Such "weak" devices are well known in the art and are described in U.S. Pat. No. 5,235,550 to Zagar, entitled "Method for-Maintaining Optimum Biasing Voltage and Standby Current Levels in a DRAM Array Having Repaired Row-to-Column Shorts".

FIG. 3 illustrates another embodiment of an equilibrate circuit 132. A plateline isolation transistor 134 is connected between portions of a plateline 136. The plateline isolation transistor 134 is responsive to a signal ISO_PL, which is driven to a logic high value to isolate portions of the plateline 136 from other portions of the plateline 136, such as the portion connected to a column decoder. A bitline isolation transistor 138 is connected between portions of a bitline 140. The bitline isolation transistor 138 is responsive to a signal ISO_BL, which is driven to a logic high value to isolate portions of the bitline 140 from other portions of the bitline 140, such as the portion connected to a column decoder.

A plateline equilibration transistor 142 is connected between a power rail, which has a midpoint voltage value of VCC/2, and the plateline 136. The transistor 142 is responsive to a signal EQ_PL, which is driven to a logic high value to cause the transistor 142 to become conductive, thereby precharging the plateline 136 by driving the voltage thereon toward the midpoint voltage prior to equilibration. The transistor 136 is, for example, a "strong" device with the characteristics described above in conjunction with the transistor 120.

A bitline equilibration transistor 144 is connected between a power rail, which has a midpoint voltage value of, for example, VCC/2, and the bitline 140. The transistor 144 is responsive to a signal EQ_BL, which is driven to a logic high value to cause the transistor 144 to become conductive, thereby precharging the bitline 140 by driving the voltage thereon toward the midpoint voltage prior to equilibration. The transistor 144 is, for example, a "strong" device with the characteristics described above in conjunction with the transistor 120.

A transistor 146, which is connected between the plateline 136 and the bitline 140, operates to equilibrate the plateline 136 and the bitline 140 when a signal EQ_BOTH is driven high. The transistor 146 is, for example, a "weak" device with the characteristics described above in conjunction with the transistor 130.

FIG 4 illustrates a timing diagram of the operation of an equilibrate circuit that is constructed according to the teachings of the present invention. The y-axis represents the voltage level of a signal and the x-axis represents elapsed time. The signals BLA and PLA represent the voltage values of the bitline and plateline during the read of a logic high value from a memory cell that is connected to the bitline and the plateline. The signals BLB and PLB represent the voltage values of the bitline and the plateline during the read of a logic low value from a memory cell that is connected to the bitline and the plateline.

At time t=16, while portions of the plateline and the bitline are isolated (ISO(BOTH)), the WORDLINE signal fires and the contents of the addressed memory cell appear on the bitline. Thus, the bitline, as represented by the signal BLA (or BLB), begins to assume the value of the memory cell. The plateline, as represented by the signal PLA (or PLB), assumes a voltage value that is opposite in polarity to the signal BLA (or BLB).

At time t=32, the plateline and the bitline are released from their states of isolation, as represented in FIG. 4 by the ISO(BOTH) signal being driven to a logic low value. At time t=36, the plateline equilibration signal PL_EQ transitions high, thus enabling the connection of the plateline to a voltage equal to VCC/2 (1 volt in FIG. 4). The plateline then begins assuming the value VCC/2, and by time t=48, the plateline is at approximately VCC/2.

At approximately time t=40, the bitline has assumed the approximate voltage value of either VCC or GND, depending on the value read from the memory cell. At time t=44, a portion of the bitline is isolated, as indicated by the signal ISO_BL in FIG. 4. The bitline is isolated until time t=100, when the signal ISO_BL falls. During the period of bitline isolation, the bitline holds its previous value. At approximately time t=104, the wordline signal is driven low, and the memory cell read is complete.

At time t=108, the bitline is equilibrated when the EQ_BL signal is pulsed for approximately 5 time units. The voltage of the bitline is thus driven toward VCC/2 at approximately time t=110. At time t=116, portions of the plateline and the bitline are both isolated, as indicated by ISO(BOTH) in FIG. 4, and the EQ_BOTH signal is activated, thus shorting the bitline to the plateline and equilibrating the bitline and the plateline.

Figure 5:
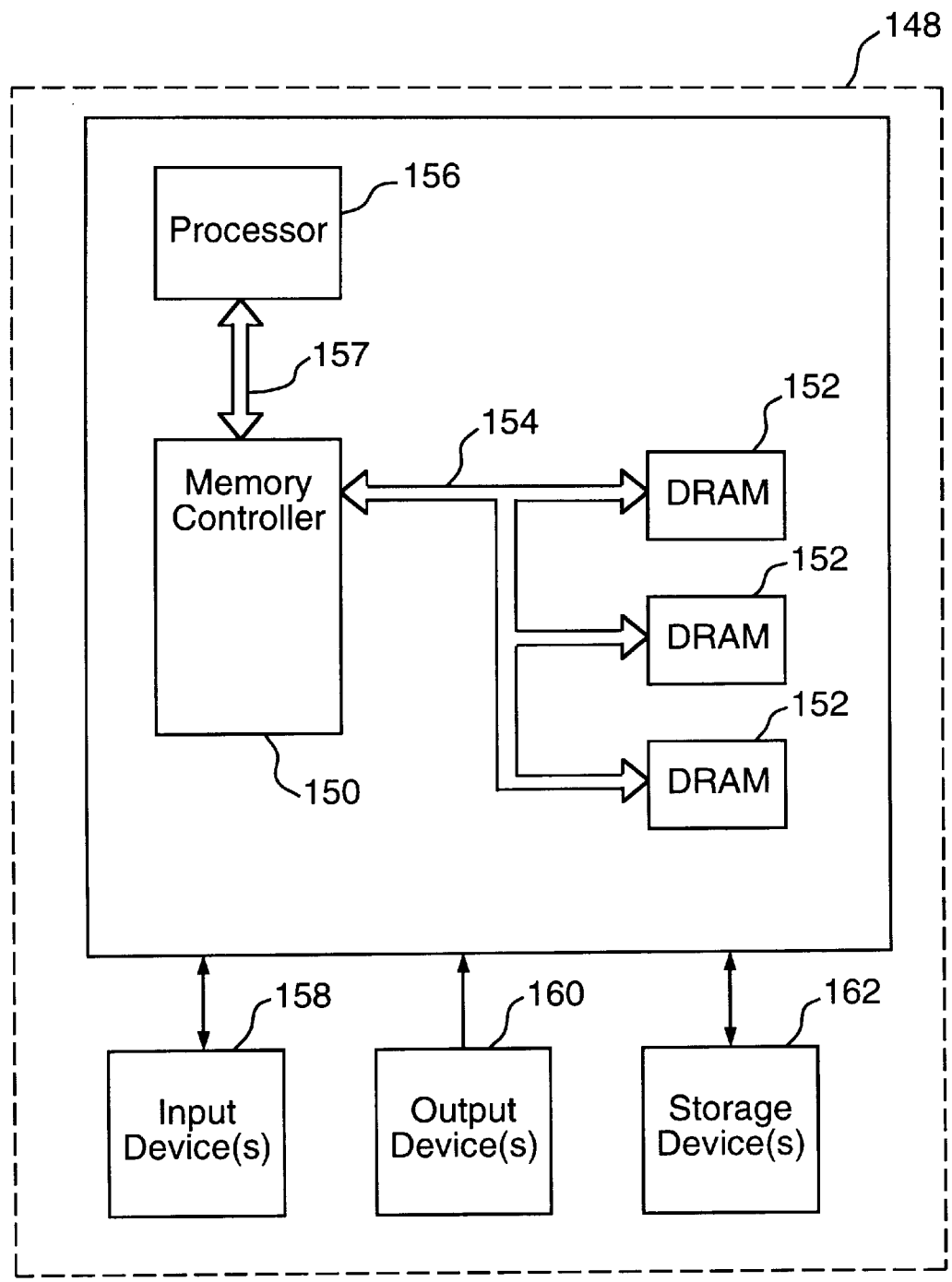
FIG. 5 is a block diagram of a system in which the present invention may be used.

FIG. 5 illustrates a computer system 148. The computer system 148 utilizes a memory controller 150 in communication with dynamic plate sensing memories 152 through a bus 154. The memory controller 150 is also in communication with a processor 156 through a bus 157. The processor 156 can perform a plurality of functions based on information and data stored in the memories 152. One or more input devices 158, such as a keypad or a mouse, are connected to the processor 156 to allow an operator to manually input data, instructions, etc. One or more output devices 160 are provided to display or otherwise output data generated by the processor 156. Examples of output devices include printers and video display units. One or more data storage devices 162 may be coupled to the processor 156 to store data on, or retrieve information from, external storage media. Examples of storage devices 162 and storage media include drives that accept hard and floppy disks, tape cassettes, and CD read only memories.

The present invention also contemplates a method for equilibrating a plateline and a bitline of a dynamic plate sensing memory device. The method comprises the step of driving the bitline and the plateline toward a predetermined voltage and the step of connecting the bitline to the plateline.

While the present invention has been described in conjunction with preferred embodiments thereof, many modifications and variations will be apparent to those of ordinary skill in the art. The foregoing description and the following claims are intended to cover all such modifications and variations.

What is claimed is:

1. A circuit for equilibrating a bitline and a plateline of a dynamic plate sensing memory device, comprising:
    a first device for driving the plateline toward a predetermined voltage in response to a first control signal;
    a second device for driving the bitline toward said predetermined voltage in response to a second control signal;
    a third device for connecting the plateline to the bitline in response to a third control signal.

2. The circuit of claim 1 further comprising an isolation device for isolating portions of the plateline in response to a fourth control signal.

3. The circuit of claim 2 wherein said isolation device is a switch.

4. The circuit of claim 1 further comprising an isolation device for isolating portions of the bitline in response to a fourth control signal.

5. The circuit of claim 4 wherein said isolation device is a switch.

6. A circuit for equilibrating a bitline and a plateline of a dynamic plate sensing memory device, comprising:
    a first switch for connecting the plateline to a predetermined voltage in response to a first control signal;
    a second switch for connecting the bitline to said predetermined voltage in response to a second control signal; and
    a third switch for connecting the plateline to the bitline in response to a third control signal.

7. The circuit of claim 6 wherein said first switch is a transistor sized to provide a drain to source current such that a switching time for a node being driven by said transistor is primarily a function of impedance of the node and not the characteristics of said transistor.

8. The circuit of claim 6 wherein said second switch is a transistor sized to provide a drain to source current such that a switching time for a node being driven by said transistor is primarily a function of impedance of the node and not the characteristics of said transistor.

9. The circuit of claim 6 wherein said third switch is a transistor which is sized to provide limited drain to source current.

10. A circuit for equilibrating a bitline and a plateline of a dynamic plate sensing memory device, comprising:

a first switch for connecting the plateline to a predetermined voltage in response to a first control signal;

a bitline equilibration device for driving the bitline toward said predetermined voltage in response to a second control signal; and a second switch for connecting the plateline to the bitline in response to a third control signal.

11. The circuit of claim 10 wherein said first switch is a transistor sized to provide a drain to source current such that a switching time for a node being driven by said transistor is primarily a function of impedance of the node and not the characteristics of said transistor.

12. The circuit of claim 10 wherein said second switch is a transistor which is sized to provide limited drain to source current.

13. A semiconductor dynamic plate sensing memory device, comprising:

a memory array, said array having a bitline and a plateline extending therefrom;

a circuit for writing information to said array and for reading information from said array using said bitline and said plateline; and a plurality of equilibrate circuits for equilibrating said bitline and said plateline, each equilibrate circuit comprising:

a first device for driving the plateline toward a predetermined voltage in response to a first control signal;

a bitline equilibration device for driving the bitline toward said predetermined voltage in response to a second control signal; and a third device for connecting the plateline to the bitline in response to a third control signal.

14. A system, comprising:

a processor;

a memory controller;

a plurality of dynamic plate sensing memory devices;

a first bus connecting said processor and said memory controller;

a second bus interconnecting said memory controller and said memory devices, each of said memory devices having a circuit for equilibrating a bitline and a plateline of said memory device, comprising:

a first device for driving the plateline toward a predetermined voltage in response to a first control signal;

a bitline equilibration device for driving the bitline toward said predetermined voltage in response to a second control signal; and a third device for connecting the plateline to the bitline in response to a third control signal.

15. A method for equilibrating a plateline and a bitline of a dynamic plate sensing memory device, comprising the steps of:

driving the bitline and the plateline toward a predetermined voltage; and connecting the bitline to the plateline.

16. A method for equilibrating a plateline and a bitline of a dynamic plate sensing memory device, comprising:

driving the plateline toward a predetermined voltage;

equilibrating the bitline toward said predetermined voltage; and connecting the bitline to the plateline.

17. The method of claim 16 wherein said equilibrating the bitline toward said predetermined voltage includes connecting the bitline to a voltage rail, said voltage rail selected from the group consisting of an array voltage and ground.

18. The method of claim 16 further comprising isolating portions of the bitline prior to said equilibrating the bitline toward said predetermined voltage.

19. The method of claim 16 wherein said connecting the bitline to the plateline further comprises isolating portions of the bitline and isolating portions of the plateline.

20. A circuit for equilibrating a bitline and a plateline of a dynamic plate sensing memory device, comprising:

means for driving the plateline toward a predetermined voltage in response to a first control signal;

means for driving the bitline toward a predetermined voltage in response to a second control signal; and means for connecting the plateline to the bitline in response to a third control signal.

21. The circuit of claim 20, wherein said means for driving the plateline toward a predetermined voltage is a switch.

22. The circuit of claim 21, wherein said switch is a transistor sized to provide a drain to source current such that a switching time for a node being driven by said transistor is primarily a function of an impedance of the node and not the characteristics of the transistor.

23. The circuit of claim 20, wherein said means for driving the bitline toward a predetermined voltage is a switch.

24. The circuit of claim 23, wherein said switch is a transistor sized to provide a drain to source current such that a switching time for a node being driven by said transistor is primarily a function of an impedance of the node and not the characteristics of the transistor.

25. The circuit of claim 20, wherein said means for connecting the plateline to the bitline is a switch.

26. The circuit of claim 25, wherein said switch is a transistor sized to provide limited drain to source current.

27. The circuit of claim 20, further comprising means for isolating portions of the plateline in response to a fourth control signal.

28. The circuit of claim 27, wherein said means for isolating portions of the plateline is a switch.

29. The circuit of claim 20, further comprising means for isolating portions of the bitline in response to a fourth control signal.

30. The circuit of claim 29, wherein said means for isolating portion of the bitline is a switch.

* * * * *

UNITED STATES PATENT AND TRADEMARK OFFICE
CERTIFICATE OF CORRECTION

PATENT NO. : 6,094,391
DATED : July 25, 2000
INVENTOR(S) : Pinney, D.

It is certified that error appears in the above-identified patent and that said Letters Patent is hereby corrected as shown below:

Column 1,
Line 31, delete "values." and substitute therefor -- value. --.

Column 2,
Line 13, delete "connection" and substitute therefor -- connecting --.
Line 14, delete "hitline" and substitute therefor -- bitline --.
Line 21, delete "a-bitline" and substitute therefor -- a bitline --.
Line 41, delete "of: the" and substitute therefor -- of the --.

Column 3,
Line 1, delete "(RAS*). AS" and substitute therefor -- RAS*), --.
Line 30, delete "9 sense" and substitute therefor -- P-sense --.

Column 4,
Line 51, delete "for-Maintaining" and substitute therefor -- for Maintaining --.

Signed and Sealed this

Twenty-sixth Day of July, 2005

JON W. DUDAS
*Director of the United States Patent and Trademark Office*